(12) United States Patent
Smith et al.

(10) Patent No.: US 10,746,799 B2
(45) Date of Patent: Aug. 18, 2020

(54) BREAKER MEASUREMENT STRUCTURE FOR POWER DISTRIBUTION UNIT

(71) Applicant: Eaton Corporation, Cleveland, OH (US)

(72) Inventors: Josiah Daniel Smith, Mission Viejo, CA (US); George Chen, Taipei (TW); Long Larry Le, Morrisville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 47 days.

(21) Appl. No.: 15/884,930

(22) Filed: Jan. 31, 2018

(65) Prior Publication Data

US 2019/0235024 A1    Aug. 1, 2019

(51) Int. Cl.
| | |
|---|---|
| *G01R 31/327* | (2006.01) |
| *H01H 73/06* | (2006.01) |
| *H02H 1/00* | (2006.01) |
| *H02H 7/22* | (2006.01) |
| *H05K 7/14* | (2006.01) |

(52) U.S. Cl.
CPC ..... *G01R 31/3274* (2013.01); *G01R 31/3275* (2013.01); *H01H 73/06* (2013.01); *H02H 1/0007* (2013.01); *H02H 7/222* (2013.01); *H05K 7/1492* (2013.01)

(58) Field of Classification Search
CPC ... H02H 1/0007; H01H 73/06; G01R 31/3275
See application file for complete search history.

(56) References Cited

U.S. PATENT DOCUMENTS

| | | | |
|---|---|---|---|
| 9,041,250 B1* | 5/2015 | Czamara | H02J 3/14 307/64 |
| 2005/0122655 A1* | 6/2005 | Hotchkiss | H02H 9/044 361/103 |
| 2007/0046103 A1* | 3/2007 | Belady | H02G 3/00 307/12 |
| 2008/0093927 A1* | 4/2008 | Ewing | H05K 7/1492 307/23 |
| 2012/0062273 A1* | 3/2012 | Hsu | H05K 7/1492 324/764.01 |

* cited by examiner

*Primary Examiner* — Alvaro E Fortich
(74) *Attorney, Agent, or Firm* — Squire Patton Boggs (US) LLP

(57) ABSTRACT

A power distribution unit includes a circuit protection device having output terminals and a current transformer board connected to the output terminals of the circuit protection device. The power distribution unit further includes a signal board connected to the current transformer board and a measurement board connected to the signal board.

12 Claims, 4 Drawing Sheets

BREAKER MEASUREMENT STRUCTURE FOR POWER DISTRIBUTION UNIT

FIELD OF INVENTION

The present disclosure relates power distribution units ("PDUs"). More specifically, the present disclosure relates to PDUs that include structure for measuring voltage or current.

BACKGROUND

In data centers and other industrial environments, a power source is typically provided to information technology ("IT") equipment with a three-phase busway that carries current. Each phase can be provided separately to different types of IT equipment. In some instances, the three-phase busway provides power to a rack that holds electrical equipment such as servers. The IT equipment located in the rack receives power from the busway via a PDU mounted to the rack frame. The PDU includes a connection to the three-phase busway, and a plurality of components to provide, regulate, and monitor the current being distributed to the IT equipment in the rack.

PDUs have many circuit protection options, and may include, without limitation, a single circuit breaker, multiple circuit breakers, a single fuse, multiple fuses, one or more residual-current devices, one or more reclosers, one or more polyswitches, and any combination of these and other protection devices. Such devices may broadly be referred to as circuit protection devices. A PDU may be configured to accept a three-phase wye voltage input, a three-phase delta voltage input, or a single-phase voltage input. Due to the many variations of circuit protection devices in PDUs, integrated measurements have not been able to be used. Instead, current transformers have been used on wires to provide flexibility of placement.

It is desirable to measure the output voltage of circuit protection devices to detect if a circuit protection device has tripped, blown, or otherwise faulted. To do so, however, requires another set of control wires connected to the output of each protection device. The resulting number of wires can be difficult to manage and may increase the size of the PDU.

SUMMARY

In one embodiment, an integrated printed circuit board assembly system of a power distribution unit is provided. The integrated printed circuit board assembly system includes a plurality of current transformer boards, with each current transformer board being configured to connect to a circuit protection device. The integrated printed circuit board assembly system also has a plurality of measurement boards, including at least a first measurement board and a second measurement board. Each of the plurality of measurement boards is configured to measure at least one of a voltage and a current. The integrated printed circuit board assembly system further includes a signal board connected to each of the plurality of current transformer boards and connected to each of the plurality of measurement boards. The signal board collects voltage and current signals from each of the plurality of current transformer boards and distributes the voltage and current signals to the plurality of measurement boards.

In another embodiment, a method of assembling a power distribution unit includes providing a circuit protection device having output terminals, providing a current transformer board, and connecting the current transformer board to the output terminals of the circuit protection device. The method further includes providing a signal board and connecting the signal board to the current transformer board. The method also includes providing a measurement board and connecting the measurement board to the signal board.

In yet another embodiment, a power distribution unit includes a circuit protection device having output terminals and a current transformer board connected to the output terminals of the circuit protection device. The power distribution unit further includes a signal board connected to the current transformer board and a measurement board connected to the signal board.

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
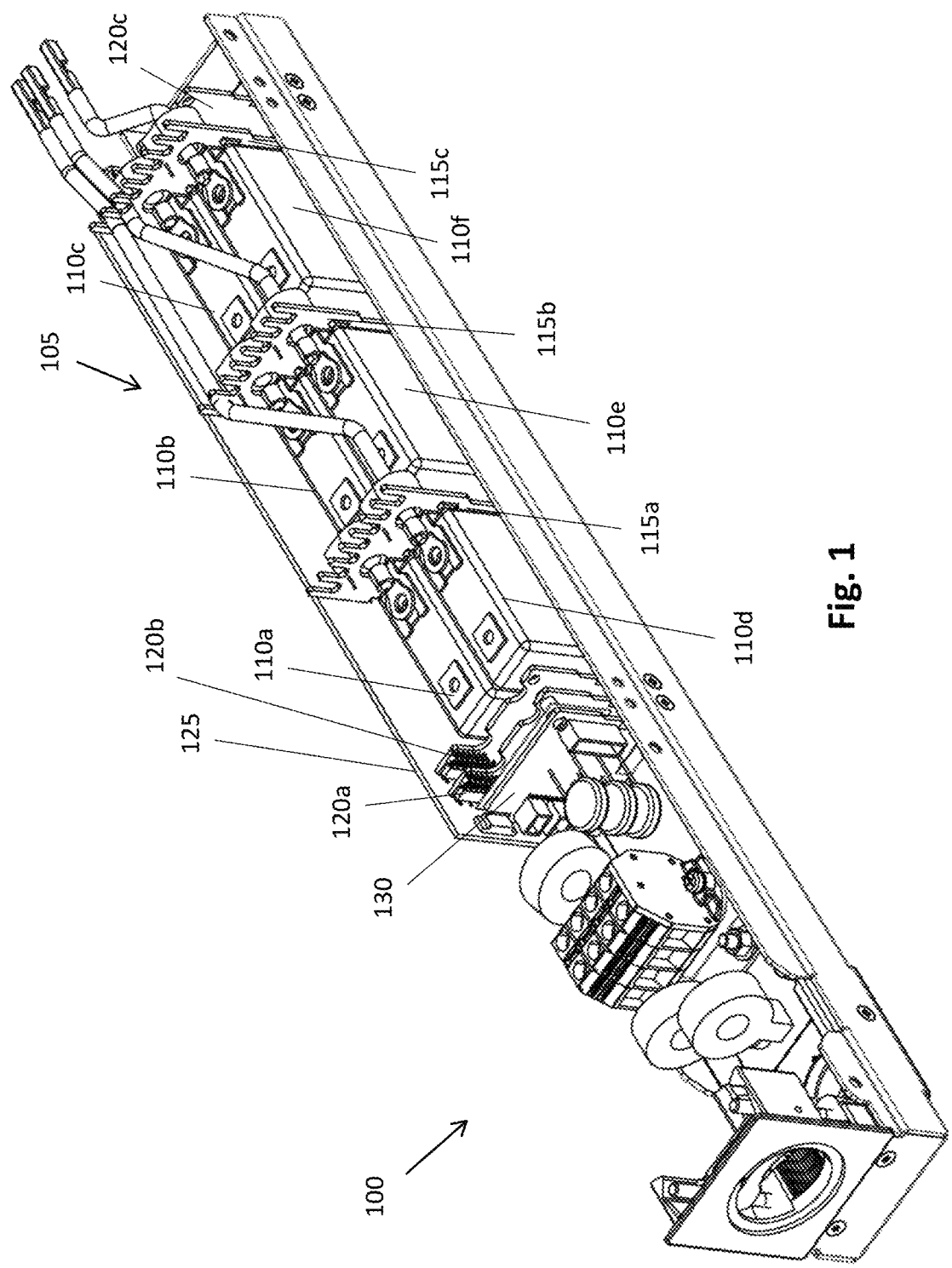
FIG. 1 is a perspective view of one embodiment of a PDU having a printed circuit board assembly.

FIG. 1 is a perspective view of one embodiment of a PDU 100 having an integrated printed circuit board assembly 105. In the illustrated embodiment, the PDU 100 has six circuit protection devices, including a first circuit protection device 110a, a second circuit protection device 110b, a third circuit protection device 110c, a fourth circuit protection device 110d, a fifth circuit protection device 110e, and a sixth circuit protection device 110f. While circuit breakers are shown in the illustrated embodiment, it should be understood that other circuit protection devices may be employed. In alternative embodiments (not shown), the PDU includes five or fewer circuit protection devices, including an embodiment in which the PDU has a single circuit protection device. In other alternative embodiments (not shown), the PDU includes seven or more circuit protection devices.

The printed circuit board assembly 105 of the PDU 100 has three current transformer ("CT") boards, including a first CT board 115a, a second CT board 115b, and a third CT board 115c. Each CT board 115a,b,c is connected to a pair of circuit protection devices. In an alternative embodiment (not shown), each CT board is connected to a single circuit protection device. While three CT boards are shown in the illustrated embodiment, any number of CT boards may be employed.

The printed circuit board assembly 105 of the PDU 100 further includes three measurement boards, including a first measurement board 120a, a second measurement board 120b, and a third measurement board 120c. Each of the measurement boards 120a,b,c is configured to measure at least one of a voltage and a current. In alternative embodiments (not shown), the PDU only has one or two measurement boards. In other alternative embodiments (not shown), the PDU has four or more measurement boards.

In the illustrated embodiment, a signal board 125 is connected to each of the CT boards 115a,b,c and is further connected to each of the measurement boards 120a,b,c. In one embodiment, the signal board 125 collects voltage and current signals from each of the CT boards 115a,b,c and distributes the voltage and current signals to the measurement boards 120a,b,c. In an alternative embodiment, the signal board 125 collects only voltage signals from each of the CT boards 115a,b,c and distributes the voltage signals to the measurement boards 120a,b,c. In another alternative embodiment, the signal board 125 collects only current signals from each of the CT boards 115a,b,c and distributes the current signals to the measurement boards 120a,b,c.

The printed circuit board assembly 105 of the PDU 100 further includes an input board 130 connected to the first measurement board 120a. The input board 130 provides an input voltage and current signal to the first measurement board 120a.

The PDU 100 includes additional components that are not discussed in detail in this disclosure. The PDU further includes a housing (not shown) to protect the components and provide insulation.

Figure 2:
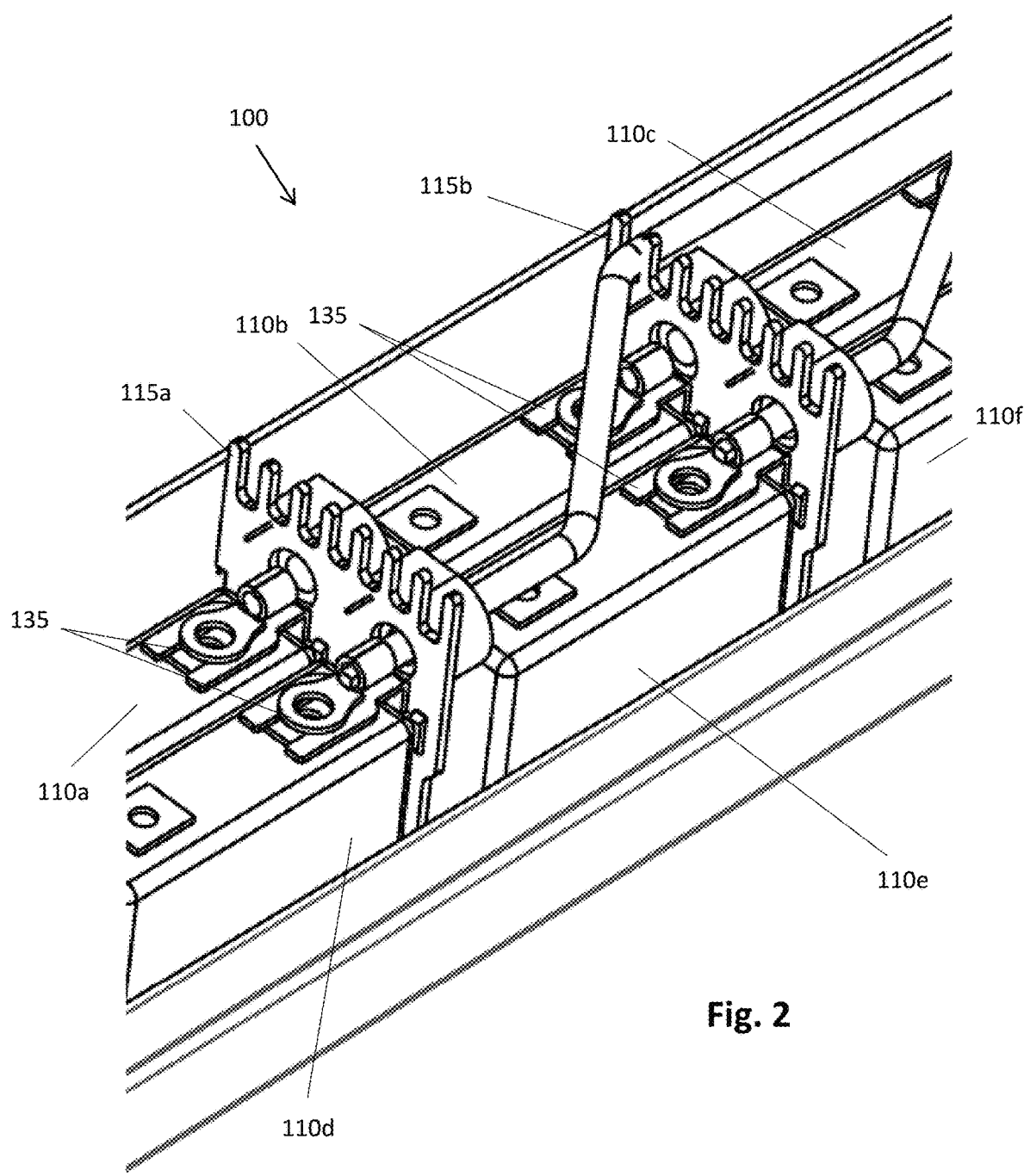
FIG. 2 is a close-up, perspective view of current transformer boards in the PDU of FIG. 1.

FIG. 2 is a close-up, perspective view of the first and second CT boards 115a,b. As can be seen in this view, each of the CT boards 115a,b includes integrated voltage sense terminals 135 connected to the output terminals of the circuit protection devices 110. In the illustrated embodiment, each CT board 115 has two voltage sense terminals 135, with each voltage sense terminal 135 being connected to a respective circuit protection device 110. However, in alternative embodiments, each CT board may have any number of integrated voltage sense terminals.

In the illustrated embodiment, a pair of current transformers 140 are connected to each CT board 115a,b,c. Each current transformer 140 is a type of transformer that is used to measure alternating current. Each current transformer 140 provides a secondary current that is accurately proportional to the current flowing in its primary. Thus, the current transformers 140 scale large values of voltage or current to small, standardized values that are easy to handle for measurement.

The current transformers 140 may be used with wires or busbars. In the illustrated embodiment, a wire is connected to an output terminal of a circuit protection device 110 and passes through a respective current transformer 140. The wires are secured by wire guide features. In an alternative embodiment, a busbar (not shown) is connected to an output terminal of a circuit protection device 110 and passes through a respective current transformer 140. Using a wire or busbar to conduct the current from the circuit protection device terminal improves the thermal performance of the circuit protection device. The CT boards 115 also have integrated wire routing features to help organize the wires or busbars.

Figure 3:
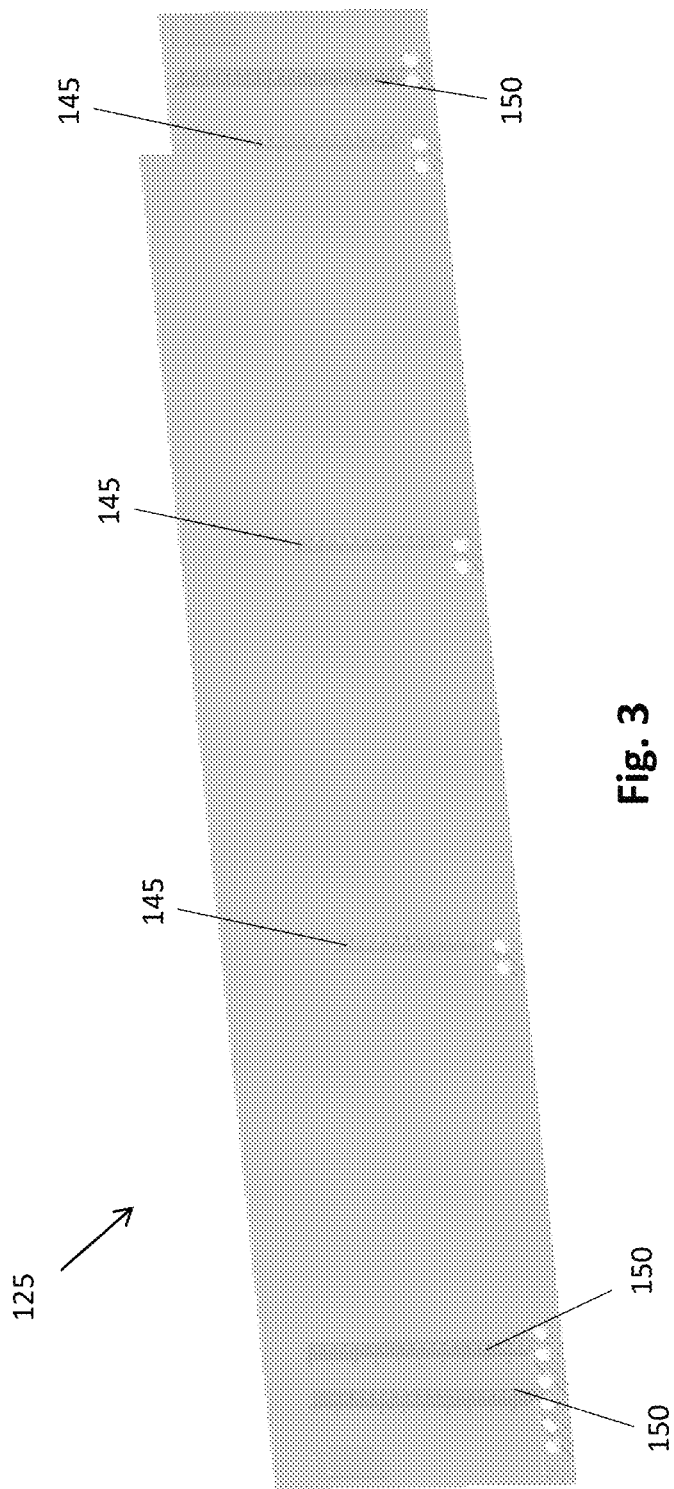
FIG. 3 is a front view of one embodiment of a signal board for a printed circuit board assembly.

FIG. 3 is a front view of the signal board 125 of the printed circuit board assembly of FIG. 1. The signal board 125 collects the voltage and current signals from each CT board 115 and distributes them to the measurement boards 120. It also carries communication and power buses to each measurement board 120.

The signal board 125 has a first side and a second side. The first side (shown in this view) has a plurality of connectors, including a plurality of CT connectors 145 configured to receive the CT boards 115 and a plurality of measurement connectors 150 configured to receive the measurement boards 120. In one embodiment, the second side of the signal board 125 has no traces or components. Thus, the second side can act as an insulator, obviating the need for insulation paper or other insulators.

In the illustrated embodiment, each CT board 115 connects in a perpendicular manner to the signal board 125. In alternative embodiments (not shown), the CT boards may connect to the signal board at an acute angle.

Figure 4:
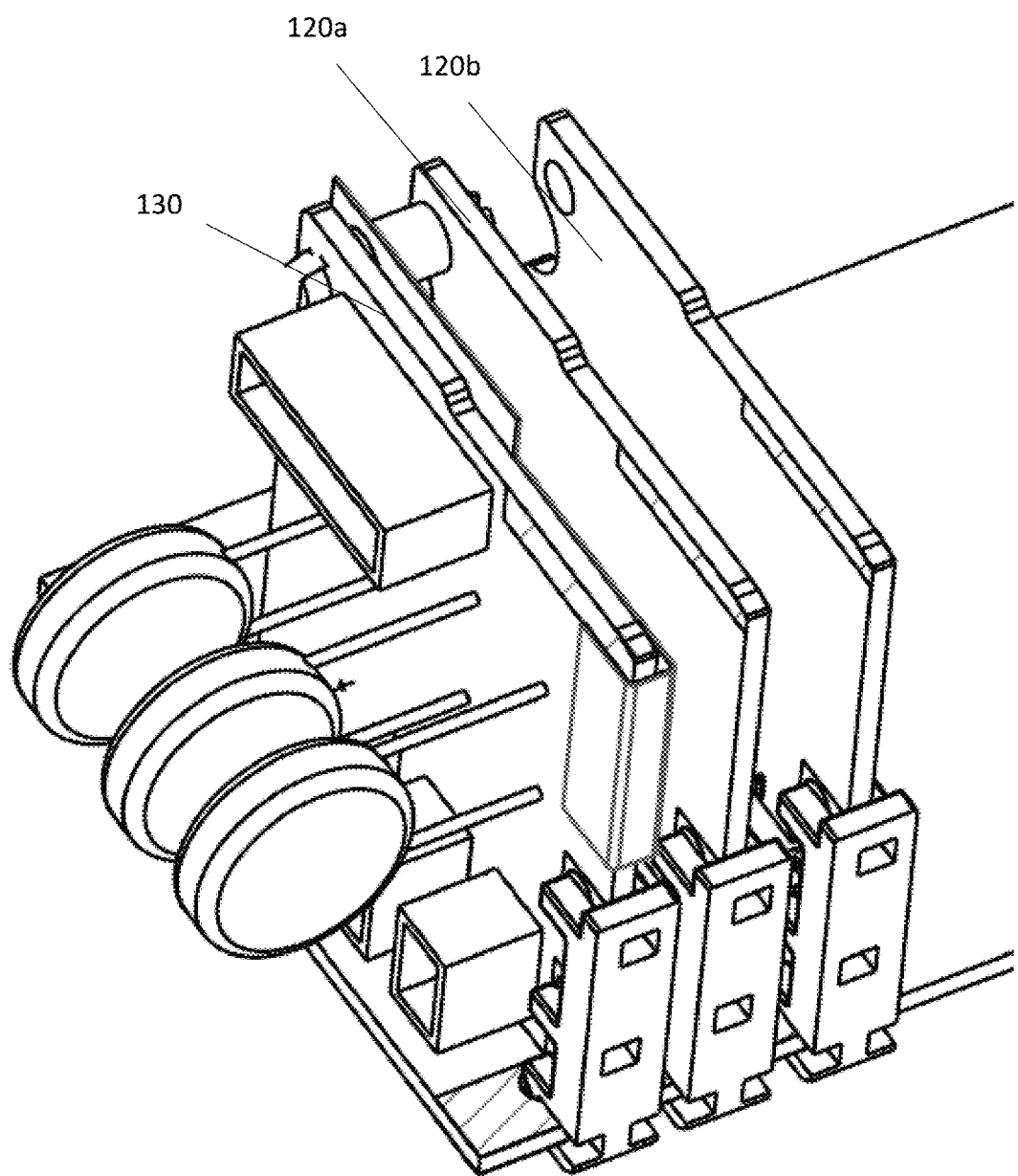
FIG. 4 is a close-up, perspective view of measurement boards and an input board in the PDU of FIG. 1.

FIG. 4 is a close-up, perspective view of the input board 130 and the first and second measurement boards 120a,b in the printed circuit board assembly 105 of the PDU 100. The input board 130 is configured to accept a voltage input. Exemplary voltage inputs include, without limitation, a three-phase wye voltage input, a three-phase delta voltage input, and a single-phase voltage input.

In the illustrated embodiment, the input board 130 is configured as a daughterboard on the first measurement board 120a. It may have input connectors for three wired current transformers, and an input connector for voltage measurements. In one embodiment, the input board 130 includes metal oxide varistors to help protect the PDU from electrical surges.

In one embodiment, each measurement board 120 is configured to measure both a voltage and a current. In alternative embodiments, one or more measurement boards only measures a voltage or only measures a current. Here, each measurement board 120 is configured to accept three voltage and three current signals either from the signal board 125 or from a daughterboard, such as the input board 130.

The measurement boards 120 are used for all circuit protection device output measurements, for flexible measurements, and for PDU input measurements. In the illustrated embodiment, the first measurement board 120a measures a voltage and current from the input board 130. The second measurement board 120b measures a voltage and current from each of the first circuit protection device 110a, the second circuit protection device 110b, and the third circuit protection device 110c. The third measurement board 120c measures a voltage and a current from each of the fourth circuit protection device 110d, the fifth circuit protection device 110e, and the sixth circuit protection device 110e. It should be understood that this arrangement is merely exemplary, and that any measurement board may be used to measure a voltage or a current from any circuit protection device or input board.

To assemble a PDU, such as the PDU 100, an operator selects a circuit protection device type, and the number of circuit protection devices required for the assembly. The operator also selects a CT board type and the number of CT boards for the assembly. One type of CT board will work with a range of circuit protection devices that have the same style of terminals. In one embodiment, a doublepole CT board fits with three different circuit protection device types, and a singlepole CT board fits with four different circuit protection device types. The operator connects the CT board to the output terminals of the circuit protection device.

The operator also selects a signal board. Different signal boards may be used depending on the spacing between the protection devices, but deeper protection devices may be accommodated because the signal board is mechanically held only by the CT boards. The CT boards rest on the circuit protection device terminals and are not attached to any other points in the PDU housing. After the signal board is selected, the operator connects the signal board to the CT boards.

The operator also selects the number of measurement boards and connects the measurement board to the signal board. The operator also selects an input board type. Input board types may include, without limitation, a three-phase wye input board, a three-phase delta input board, and a single-phase input board. After the input board type is selected, the operator connects the selected input board to a first measurement board.

Additional components of the PDU may also be selected. When the assembly is complete, the PDU is covered by a housing.

Components of the PDU may be provided separately. For example, a CT board may be provided separately. One such CT board would include at least one current transformer and at least one voltage sense terminal that connects directly to a circuit protection device output terminal. The CT board would further include a wire or busbar that passes through each CT and connects directly to the circuit protection device output terminal. In one embodiment, the CT board would also include an output containing voltage and current measurement signals, which may be converted or measured on a separate measurement board. In an alternative embodiment, measurements are made on the CT board itself that is then in communication with the rest of the PDU.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present disclosure has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the disclosure, in its broader aspects, is not limited to the specific details, the representative system and method, and illustrative examples shown and described. Accordingly, departures may be made from such details without departing from the spirit or scope of the applicant's general inventive concept.

What is claimed is:

1. An integrated printed circuit board assembly system of a power distribution unit, the integrated printed circuit board assembly system comprising:
   a plurality of current transformer boards, each current transformer board being configured to connect to a circuit protection device;
   a plurality of measurement boards, including at least a first measurement board and a second measurement board,
   wherein each of the plurality of measurement boards is configured to measure at least one of a voltage and a current; and
   a signal board connected to each of the plurality of current transformer boards and connected to each of the plurality of measurement boards,
   wherein the signal board collects voltage and current signals from each of the plurality of current transformer boards and distributes the voltage and current signals to the plurality of measurement boards.

2. The integrated printed circuit board assembly system of claim 1, wherein the signal board has a first side and a second side, the first side having a plurality of connectors configured to receive the plurality of current transformer boards and the plurality of measurement boards.

3. The integrated printed circuit board assembly system of claim 2, wherein the second side of the signal board has no traces or components.

4. The integrated printed circuit board assembly system of claim 1, wherein the plurality of current transformer boards includes at least a first current transformer board, a second current transformer board, and a third current transformer board.

5. The integrated printed circuit board assembly system of claim 1, wherein each of the plurality of current transformer boards includes integrated voltage sense terminals.

6. The integrated printed circuit board assembly of claim 1, further comprising an input board connected to the first measurement board, wherein the input board provides an input voltage and current signal to the first measurement board.

7. The integrated printed circuit board assembly system of claim 6, wherein the input board accepts one of a three-phase wye voltage input, a three-phase delta voltage input, and a single-phase voltage input.

8. The integrated printed circuit board assembly system of claim 6, wherein the input board includes metal oxide varistors.

9. A power distribution unit comprising:
   a circuit protection device having output terminals;
   a current transformer board connected to the output terminals of the circuit protection device, the current transformer board providing a secondary output that is proportional to an output of the circuit protection device;
   a signal board connected to the current transformer board; and
   a measurement board connected to the signal board, the signal board collecting the secondary output from the current transformer board and distributing the secondary output to the measurement board.

10. The power distribution unit of claim 9, wherein the current transformer board includes integrated sense terminals connected to the output terminals of the circuit protection device.

11. The power distribution unit of claim 10, further comprising a wire connected to at least one of the output terminals of the circuit protection device, wherein the wire passes through the current transformer.

12. The power distribution unit of claim 10, further comprising a busbar connected to at least one of the output terminals of the circuit protection device, wherein the busbar passes through the current transformer.

* * * * *